(12) United States Patent
Kinyua

(10) Patent No.: US 11,736,114 B2
(45) Date of Patent: Aug. 22, 2023

(54) ANALOG TO DIGITAL CONVERTER WITH INVERTER BASED AMPLIFIER

(71) Applicant: Taiwan Semiconductor Manufacturing Company, Ltd., Hsinchu (TW)

(72) Inventor: Martin Kinyua, Cedar Park, TX (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/872,574

(22) Filed: Jul. 25, 2022

(65) Prior Publication Data

US 2022/0360276 A1    Nov. 10, 2022

Related U.S. Application Data

(63) Continuation of application No. 17/227,949, filed on Apr. 12, 2021, now Pat. No. 11,438,004, which is a
(Continued)

(51) Int. Cl.
*H03M 1/00* (2006.01)
*H03M 1/46* (2006.01)
(Continued)

(52) U.S. Cl.
CPC ........ *H03M 1/462* (2013.01); *H03F 3/45269* (2013.01); *H03F 3/45273* (2013.01); *H03M 1/1245* (2013.01); *H03M 1/468* (2013.01)

(58) Field of Classification Search
CPC .... H03M 1/462; H03M 1/1245; H03M 1/468; H03M 1/069; H03M 1/164; H03M 1/12;
(Continued)

(56) References Cited

U.S. PATENT DOCUMENTS 5,710,563 A * 1/1998 Vu ..................... H03M 1/0663
341/161
6,469,652 B1 * 10/2002 Aude .................. H03M 1/0663
341/172

(Continued)

FOREIGN PATENT DOCUMENTS

| KR | 10-1381250 | 4/2014 |
|---|---|---|
| KR | 10-1680080 | 11/2016 |
| KR | 10-2018-0088697 | 8/2018 |

*Primary Examiner* — Jean B Jeanglaude
(74) *Attorney, Agent, or Firm* — Merchant & Gould P.C.

(57) ABSTRACT

An analog-to-digital converter ("ADC") includes an input terminal configured to receive an analog input voltage signal. A first ADC stage is coupled to the input terminal and is configured to output a first digital value corresponding to the analog input voltage signal and a first analog residue signal corresponding to a difference between the first digital value and the analog input signal. An inverter based residue amplifier is configured to receive the first analog residue signal, amplify the first analog residue signal, and output an amplified residue signal. The amplified residue signal is converted to a second digital value, and the first and second digital values are combined to create a digital output signal corresponding to the analog input voltage signal.

20 Claims, 12 Drawing Sheets

Related U.S. Application Data continuation of application No. 16/523,575, filed on Jul. 26, 2019, now Pat. No. 10,979,064.

(60) Provisional application No. 62/753,572, filed on Oct. 31, 2018.

(51) Int. Cl.
*H03M 1/12* (2006.01)
*H03F 3/45* (2006.01)

(58) Field of Classification Search
CPC .......... H03M 1/38; H03M 1/129; H03M 1/18; H03F 3/45269; H03F 3/45273; H03F 2203/30051; H03F 2203/45134; H03F 3/3028; H03F 3/4565; H03F 3/45237
USPC ........................................ 341/122
See application file for complete search history.

(56) References Cited

U.S. PATENT DOCUMENTS

| | | | |
|---|---|---|---|
| 7,417,574 | B2 | 8/2008 | Tadeparthy et al. |
| 7,589,658 | B2 | 9/2009 | Ren et al. |
| 7,652,612 | B2 | 1/2010 | Dura |
| 8,232,905 | B2 | 7/2012 | Steensgaard-Madsen |
| 9,219,490 | B1 | 12/2015 | Pereira et al. |
| 9,219,492 | B1 | 12/2015 | Lok et al. |
| 9,379,731 | B1 | 6/2016 | Roham et al. |
| 9,444,406 | B1 * | 9/2016 | Perrott ................ H03F 3/45475 |
| 9,998,131 | B1 | 6/2018 | Kinyua et al. |
| 10,164,653 | B1 | 12/2018 | Kinyua |
| 10,511,319 | B2 | 12/2019 | Kinyua |
| 10,784,883 | B1 * | 9/2020 | Tripathi ................ H03M 1/442 |
| 10,868,554 | B1 * | 12/2020 | Reitsma .............. H03M 1/0607 |
| 10,868,557 | B2 | 12/2020 | Kinyua et al. |
| 10,979,064 | B2 | 4/2021 | Kinyua |
| 11,018,683 | B2 | 5/2021 | Kinyua |
| 11,438,004 | B2 | 9/2022 | Kinyua |
| 2009/0109073 | A1 | 4/2009 | Srinvasa et al. |
| 2010/0060494 | A1 | 3/2010 | Pedersen |
| 2012/0062400 | A1 | 3/2012 | Jeon |
| 2017/0163276 | A1 | 6/2017 | Chen et al. |
| 2019/0103879 | A1 | 4/2019 | Kinyua |
| 2019/0305790 | A1 | 10/2019 | Kinyua et al. |

* cited by examiner

| Phase | 1st ADC Stage 108 | 1st Residue Amplifier 114 | 2nd ADC Stage 116 |
|---|---|---|---|
| phi1 10 | Sampling Vin By Sub-ADC and Residue DAC 12 | 1st Residue amplifier disabled. Common mode sense capacitors re-charged. 14 | A/D Conversion of Residue 16 |
| phi2 20 | A/D Conversion of Vin 22 | Reset 24 | A/D Conversion 26 |
| phi3 30 | Hold residue 32 | Amplify Residue 34 | Samples amplified residue 36 |

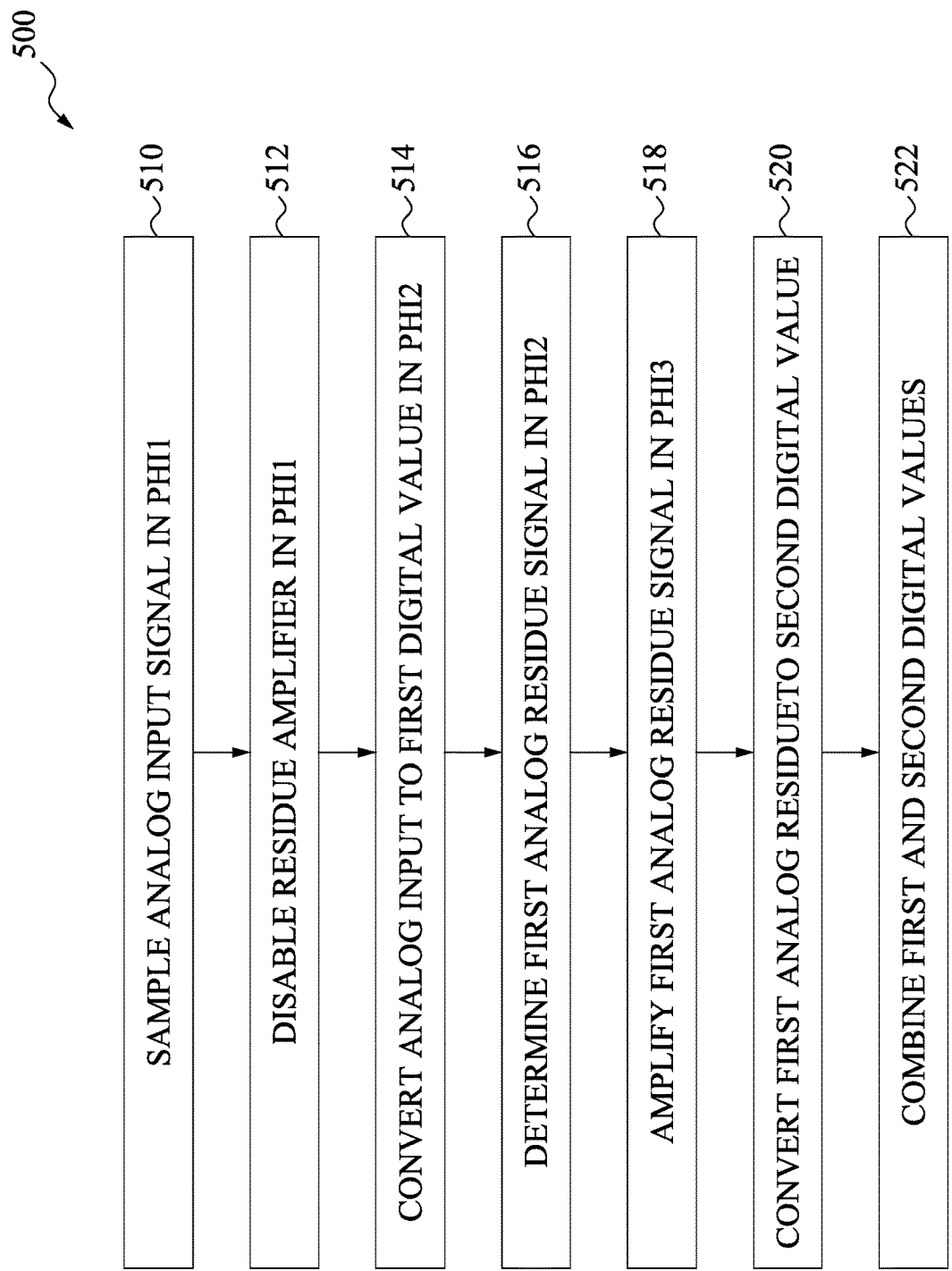

ANALOG TO DIGITAL CONVERTER WITH INVERTER BASED AMPLIFIER

CROSS-REFERENCE TO RELATED APPLICATION

This application is a continuation of U.S. patent application Ser. No. 17/227,949, filed Apr. 12, 2021, which is a continuation of U.S. patent application Ser. No. 16/523,575, filed Jul. 26, 2019, now U.S. Pat. No. 10,979,064, which claims the benefit of U.S. Provisional Patent Application No. 62/753,572, filed on Oct. 31, 2018, all of which are incorporated by reference.

BACKGROUND

Analog-to-digital converters ("ADC" or "A/D") are used in a variety of applications in order to convert a sampled analog signal into a digital signal. There are a variety of ADC architectures, such as pipelined, flash, Sigma-Delta, successive approximation register ("SAR"), etc. A pipelined, or subranging, ADC uses two or more steps of subranging. A coarse conversion of an analog input voltage to a coarse digital value is done, then the coarse digital value is converted back to an analog signal with a digital to analog converter (DAC). The coarse value is compared to the input voltage with an analog comparator, and the difference, or residue, is then converted finer and the results are combined. A successive-approximation ADC uses a comparator to successively narrow a range that contains the input voltage. At each successive step, the converter compares the input voltage to the output of a DAC that might represent the midpoint of a selected voltage range. At each step in this process, the approximation is stored in a successive approximation register (SAR). The steps are continued until the desired resolution is reached.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 13 is a flow diagram illustrating an example of an ADC method in accordance with some embodiments.

DETAILED DESCRIPTION

Figure 1:
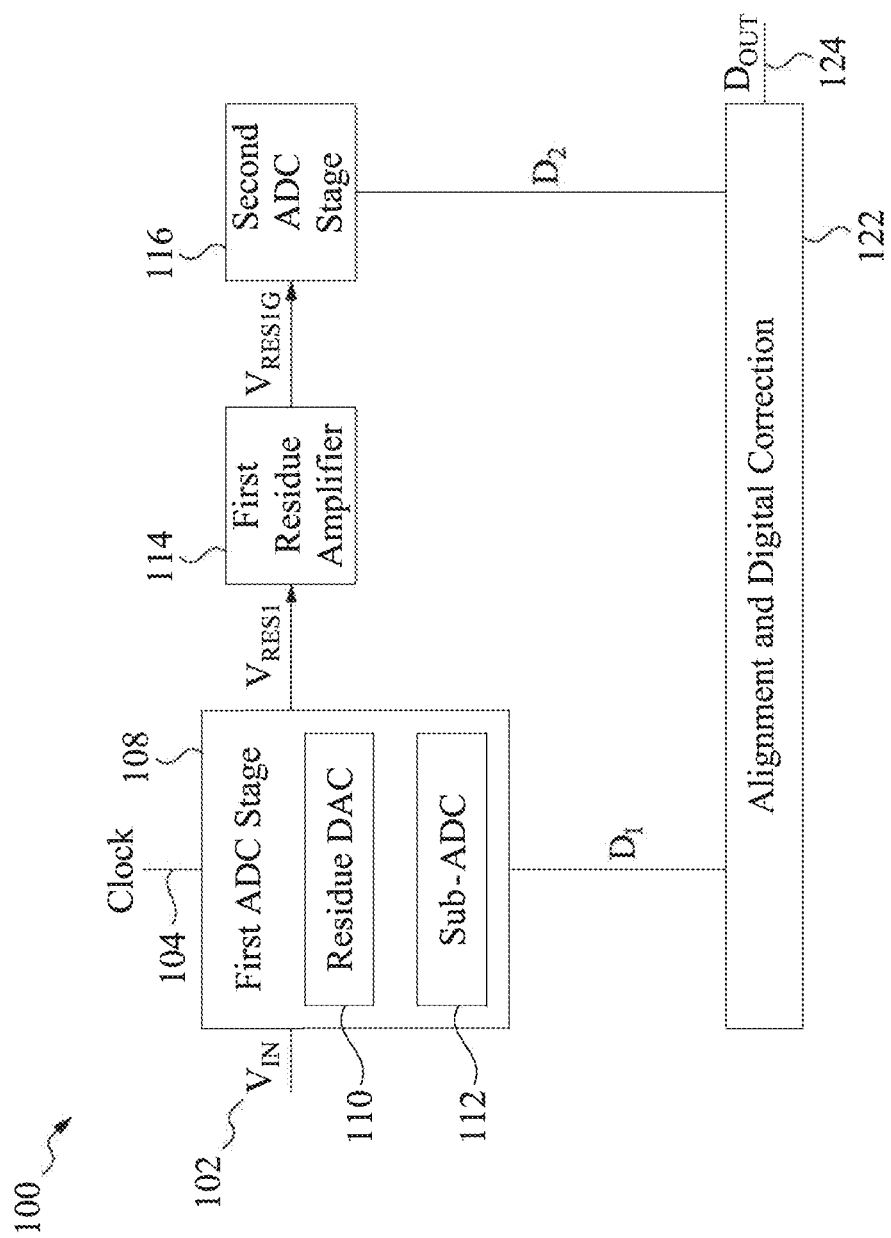
FIG. 1 is a block diagram illustrating aspects of an analog-to-digital converter ("ADC") system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Analog-to-digital converters ("ADC" or "A/D") convert an analog signal into a digital signal. Typical ADC arrangements, such as pipelined, flash, Sigma-Delta, successive approximation register ("SAR"), etc for certain applications can use too much silicon area, consume too much power, and thus can be too expensive. Moreover, with some known ADC methods, it can be difficult to attain a sufficiently high signal to noise ratio (SNR) and conversion bandwidth in low voltage and low power consumption deep submicron processes. For instance, some known pipelined ADC methods use high gain amplifiers, which are difficult to implement in FinFET processes. In accordance with aspects disclosed herein, by employing a low voltage residue amplifier, the ADC is more immune to process, voltage, and temperature (PVT) variations.

FIG. 1 is a block diagram illustrating an example of an ADC 100 that utilizes an inverter based residue amplifier. The ADC 100 includes an input terminal 102 configured to receive an analog input signal $V_{IN}$. A first ADC stage 108 is coupled to the input terminal 102 and is configured to output a first digital value $D_1$ corresponding to the analog input voltage signal $V_{IN}$, as well as a first analog residue signal $V_{RES1}$ corresponding to a difference between the first digital value $D_1$ and the analog input signal $V_{IN}$. The first digital value $D_1$ may be the most significant digits (MSB) of a digital output signal $D_{OUT}$, for example.

An inverter based residue amplifier 114 receives the first analog residue signal $V_{RES1}$, and amplifies the first analog residue signal $V_{RES1}$ to output a first amplified residue signal $V_{RES1G}$. A second ADC stage 116 receives the first amplified residue signal $V_{RES1G}$ and outputs a second digital value $D_2$ corresponding to the first amplified analog residue signal $V_{RES1G}$. An alignment and digital error correction block 122 is coupled to the first and second ADC stages 108, 116 to combine the first digital value $D_1$ and the second digital value $D_2$ into a digital output signal $D_{OUT}$ at an output terminal 124 representing the analog input voltage signal $V_{IN}$. The alignment and digital correction block 122 may be implemented by any suitable processing device.

As will be discussed further below, some examples of the first ADC stage 108 include a sub-ADC 112, such as a SAR ADC, which is configured to convert the analog input voltage signal $V_{IN}$ to the first digital value $D_1$. A digital-to-analog converter (DAC) 110 receives the first analog input voltage signal $V_{IN}$ and the first digital value $D_1$, and outputs the first analog residue signal $V_{RES1}$ based thereon. Additional subsequent ADC stage(s) 116, which may be configured similarly to the first ADC stage 108 depending on the desired resolution of the digital output signal $D_{OUT}$, may further be included.

Figure 2:
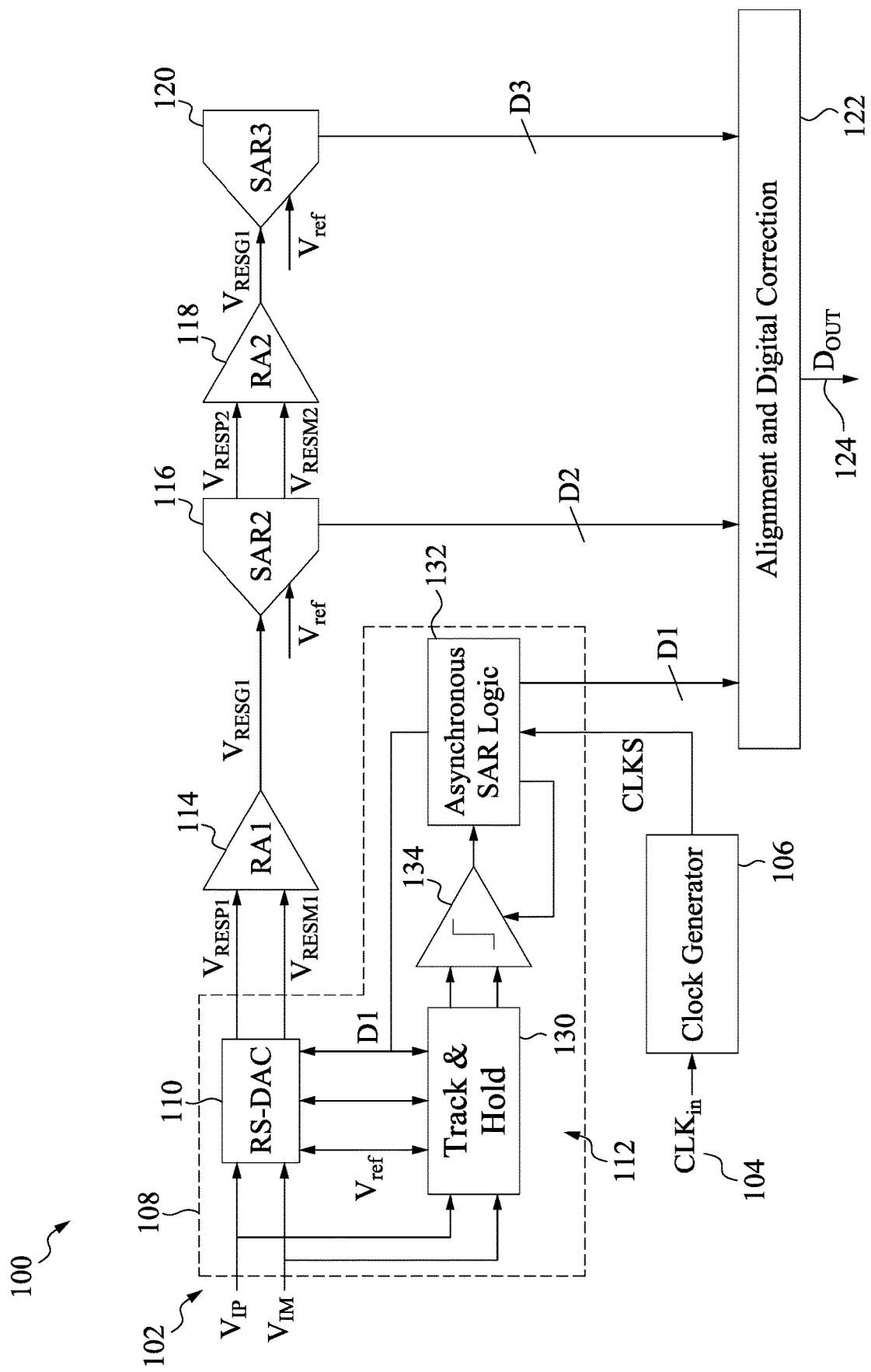
FIG. 2 is a block diagram describing examples of further aspects of the ADC system of FIG. 1 in accordance with some embodiments.

FIG. 2 illustrates further aspects of the example ADC 100 of FIG. 1. In the example shown in FIG. 2, the analog input voltage signal $V_{IN}$ includes differential input signals $V_{IP}$ and $V_{IM}$ received at the analog input voltage terminal 102. These signals are received by the first ADC stage 108, which further receives a clock signal CLKS via a clock generator 106 and a reference voltage $V_{ref}$. The sub-ADC 112 may comprise a SAR ADC, which includes a track and hold circuit 130 and a SAR logic block 132, which may be implemented by a suitably programmed processing device. The track and hold circuit 130 is connected to sample the differential analog input signals $V_{IP}$, $V_{IM}$ and provide an output signal to a comparator 134, which is coupled to the SAR logic block 132. The sub-ADC 112 outputs the first digital value $D_1$, which may be the MSBs of the digital output signal $D_{OUT}$. In the illustrated example, the $D_1$ digital output is five bits.

The first digital output $D_1$ is also output to the DAC 110, which is configured to convert the first digital output signal $D_1$ to an analog signal, and compare the converted $D_1$ signal to the input voltage signals $V_{IP}$, $V_{IM}$ and output the first residue signal $V_{RES1}$. In the illustrated example, the first residue signal $V_{RES1}$ is a differential voltage signal including $V_{RESP1}$ and $V_{RESM1}$, which are output to the first residue amplifier 114. The residue amplifier 114 amplifies the analog residue signals $V_{RESP1}$, $V_{RESM1}$ and outputs the amplified residue signal $V_{RES1G}$.

The amplified residue signal $V_{RES1G}$ is received by the second ADC stage 116, which may also include a SAR ADC. In some implementations, the structure of the second ADC stage 116 is similar to the first ADC stage 108. The second ADC stage 116 performs the A/D conversion of the amplified residue signal $V_{RES1G}$ to output a second digital signal $D_2$ that represents the next most significant bits (5 bits for example) of the digital output signal $D_{OUT}$, which is received by the alignment and digital error correction stage 122. The second ADC stage 116 also outputs a second residue signal as differential analog residue signals $V_{RESP2}$ and $V_{RESM2}$, which are received by the second residue amplifier 118. The second residue amplifier 118 outputs an amplified second residue signal $V_{RES2G}$, which may be received by a subsequent ADC stage, such as a third ADC stage 120. As with the second ADC stage 116, the structure of the third ADC stage 120 may be similar to the first ADC stage 108, and thus may also include a SAR ADC.

The third ADC stage 120 performs the A/D conversion of the second amplified residue signal $V_{RES2G}$ to output a third digital signal $D_3$ that represents the LSBs (8 bits for example) of the digital output signal $D_{OUT}$, which is received by the alignment and digital error correction stage 122. The first, second and third digital signals $D_1$, $D_2$, $D_3$ are combined in the alignment and digital error correction stage 122 before being output as digital output signal $D_{OUT}$. In the illustrated example, the alignment and digital error correction stage 122 provides a 16 bit digital output signal $D_{OUT}$, which comprise the 5 bit $D_1$ signal, the 5 bit $D_2$ signal, and the 8 bit $D_3$ signal, less two error checking bits.

Figures 3A, 3B:
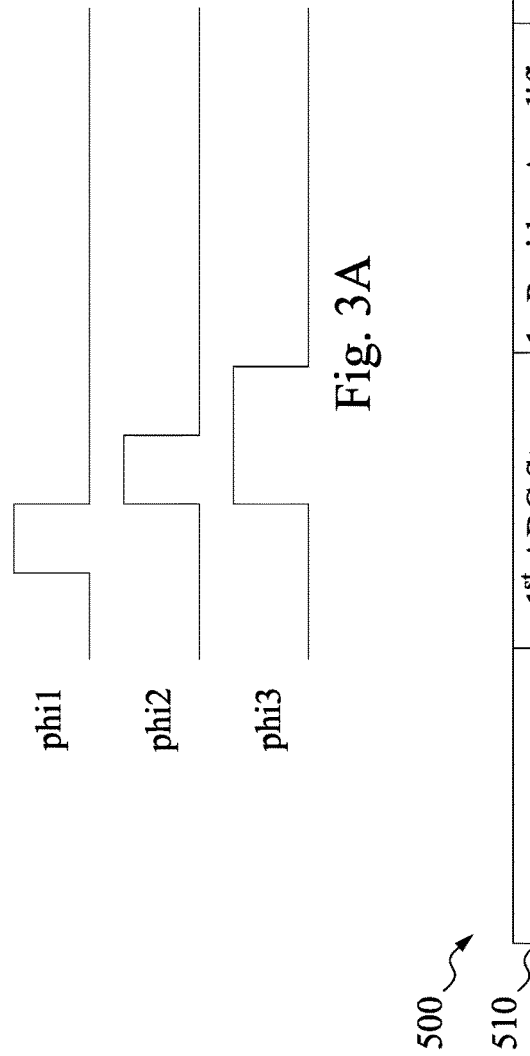
FIG. 3A is a pipeline diagram illustrating example control signals for operation phases in accordance with some embodiments.
FIG. 3B is a chart illustrating operations for various system components for example operation phases in accordance with some embodiments.

FIG. 3A is a pipeline diagram illustrating examples of control signals for three operation phases of the ADC 100. In some embodiments, the ADC 100 generally operates in response to first, second and third phase control signals phi1, phi2, phi3. Further, in some examples, third operation phase is twice as long as either the first or second operation phases, and thus, the third phase control signal has a duration about twice that of either the first or second phase control signal phi1, phi2. In other words, for a given clock cycle, the first and second phase control signals phi1, phi2 are each at a logic high level for 25% of the cycle, while the third phase control signal phi3 is at a logic high for 50% of the clock cycle.

FIG. 3B is a chart illustrating a summary of operations during the various operation phases shown in FIG. 3A for the ADC system 100. In some examples, during the first operation phase 10 (first phase control signal phi1 is high), the sub-ADC 112 and the residue DAC 110 of the first ADC stage 108 sample the analog input voltage signals $V_{IP}$, $V_{IM}$ as shown in operation 12. The first residue amplifier 114 is disabled as shown in operation 14. Additionally, common-mode sensing capacitors of residue amplifier 114 are re-charged, whereby the common-mode capacitors are used to control the output common-mode of the residue amplifier. During the second control phase 20 (second phase control signal phi2 is high), the first ADC stage 108 performs the A/D conversion of the analog input voltage $V_{IP}$, $V_{IM}$ signals in operation 22, and the residue amplifier 114 is reset in operation 24. During the third control phase 30 (third phase control signal phi3 is high), the first residue signals $V_{RESP1}$, $V_{RESM1}$ output by the first ADC stage 108 are held by the residue DAC 110 in operation 32, and the first residue amplifier 114 amplifies the received residue signal $V_{RESP1}$, $V_{RESM1}$ to output the amplified residue signal $V_{RES1G}$ in operation 34. Further, during the third control phase 30 the second ADC stage 116 samples the amplified residue signals $V_{RES1G}$ and $V_{RES2G}$ received from the first residue amplifiers 114. During subsequent first and second operation stages 10, 20, the second ADC stage 116 performs the A/D conversion of the amplified residue signals $V_{RES1G}$ and $V_{RES2G}$.

As noted above, some embodiments such as the embodiment illustrated in FIG. 2 include additional ADC stages and residue amplifiers. In addition to the first residue amplifier 114 and second ADC stage 116, the ADC system 100 shown in FIG. 2 includes the second residue amplifier 118 and third ADC stage 120. In implementations such as the example of FIG. 2, the additional stages such as the second residue amplifier 118 and third ADC stage 120 perform corresponding operations during the corresponding operation phases. Thus, the second residue amplifier 118 also is disabled during the first operation phase 10, is reset during the second operation phase 20, and amplifies the second residue signals $V_{RESP2}$, $V_{RESM2}$ during the third operation phase 30. Similarly, the third ADC stage 120 performs A/D conversion of received amplified residue signals $V_{RESPG2}$, $V_{RESM2G}$ during the first and second control phases.

Figure 4:
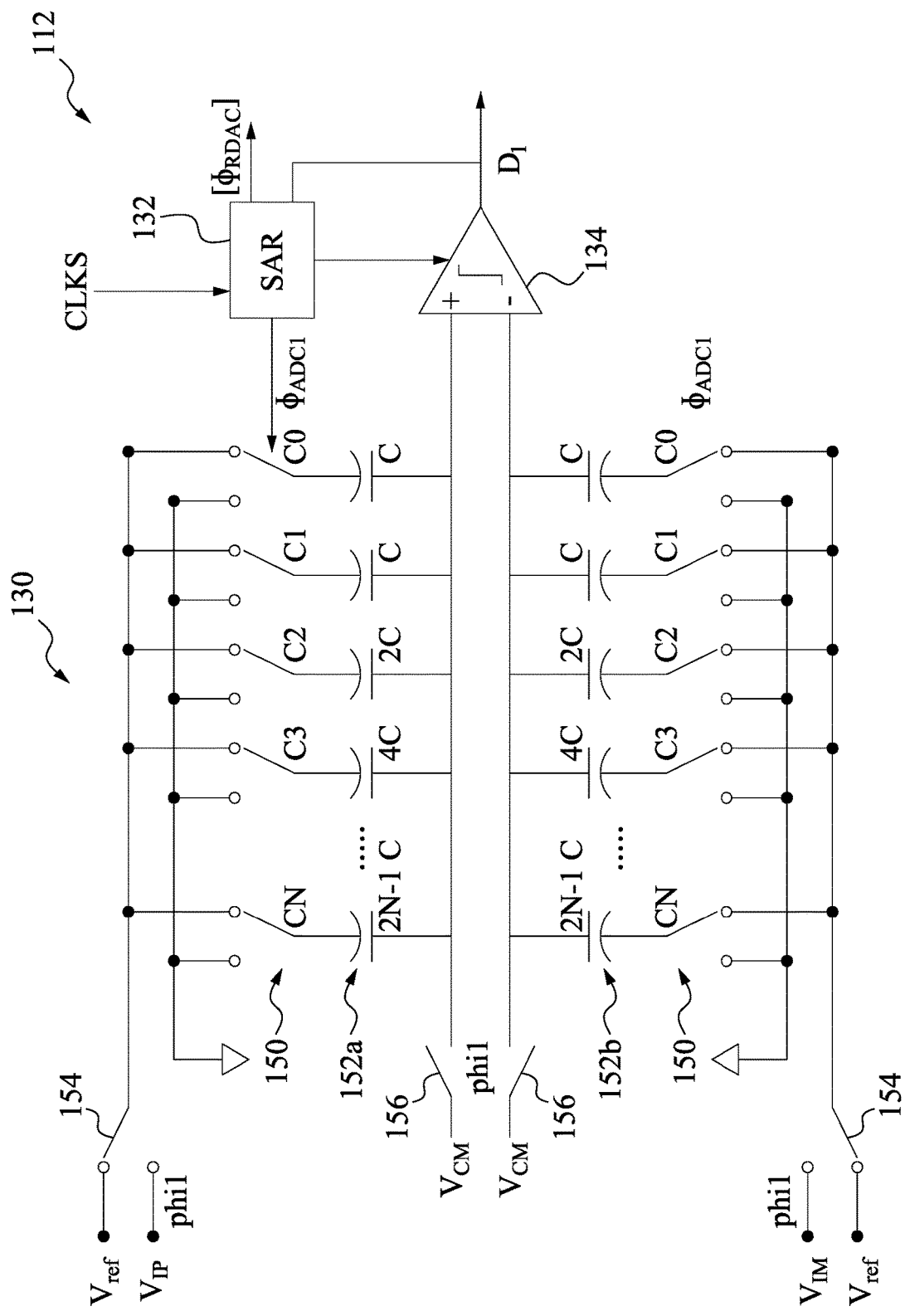
FIG. 4 is a circuit diagram illustrating an example of a sub-ADC shown in the ADC system of FIG. 2 in accordance with some embodiments.

FIG. 4 depicts an example of the sub-ADC 112 of the first ADC stage 108. In the illustrated example the sub-ADC 112 is a SAR ADC. A SAR ADC uses a comparator to successively narrow a range that contains the input voltage. At each successive step, the converter compares the input voltage to the output of a digital to analog converter. Thus, the SAR ADC 112 of the illustrated example includes the track and hold circuit 130, comparator 134 and SAR logic block 132. The SAR logic 132 receives a clock signal CLKS and provides a pulsed control signal $\phi_{ADC1}$ to the track and hold circuit 130. The control signal $\phi_{ADC1}$ controls the operation of a plurality of switches 150 operatively connected to one side of a plurality of capacitors C0-CN. In the illustrated example, there are two sets of capacitors 152a, 152b corresponding respectively to the differential analog voltage inputs $V_{IP}$ and $V_{IM}$. Each of the sets of capacitors 152a, 152b includes a plurality of capacitors C0-CN, where N may correspond to the number of bits to be converted, such as the LSB bits of the first digital signal $D_1$ shown in FIG. 2. In some examples, the capacitors C1-CN are binary weighted and the capacitor C0 is a "dummy LSB" capacitor. The minimum capacitor size C is about 2 fF in some embodiments.

Figure 5:
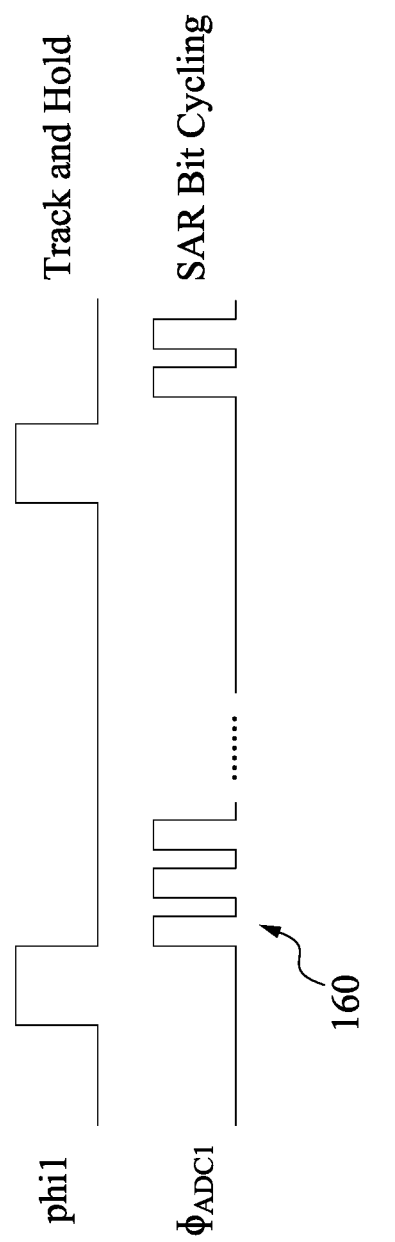
FIG. 5 is a signal diagram illustrating examples of control signals for the sub-ADC shown in FIG. 4 in accordance with some embodiments.

FIG. 5 illustrates an example of the relationship between control signals for the first control phase of the ADC 100, including the first phase control signal phi1 and the control signal $\varphi_{ADC1}$ output by the SAR logic block 132. The SAR control signal $\varphi_{ADC1}$ controls the switches 150 to connect the capacitors 152a, 152b between the analog input signal $V_{IP}$, $V_{IM}$ or the reference voltage signal $V_{ref}$ and a ground rail. The first phase control signal phi1 further controls the switches 154 to selectively connect the capacitors to either the analog input signal $V_{RESP}$, $V_{RESM}$ or the reference voltage signal $V_{ref}$, and switches 156 to selectively connect the other side of the capacitors 152a, 152b to a common mode voltage $V_{CM}$.

When the first phase control signal phi1 is high, the switches 150 operate to connect the top plates of the capacitors C0-CN of the sets of capacitors 152a, 152b to the analog input voltage signals $V_{IP}$, $V_{IM}$. At the same time, the high phi1 signal connects the bottom plates of the capacitors C0-CN of the sets of capacitors 152, 152b to the common mode voltage signal $V_{CM}$ to sample the analog input signal $V_{IP}$, $V_{IM}$. As shown in FIG. 5, during the second control phase, the phi1 control signal goes low, and the SAR logic block 132 outputs the SAR control signal $\phi_{ADC1}$. The SAR control signal $\phi_{ADC1}$ includes a series of pulses 160 derived from the second phase control signal phi2 to control the SAR binary search algorithm and generate the first digital output signal $D_1$ representing the MSBs of the analog input voltage $V_{IP}$, $V_{IM}$. The SAR logic block 132 further outputs a digital control signal $\phi_{RADC}$ that is used to control operations of the residue DAC as shown in FIG. 6.

Figure 6:
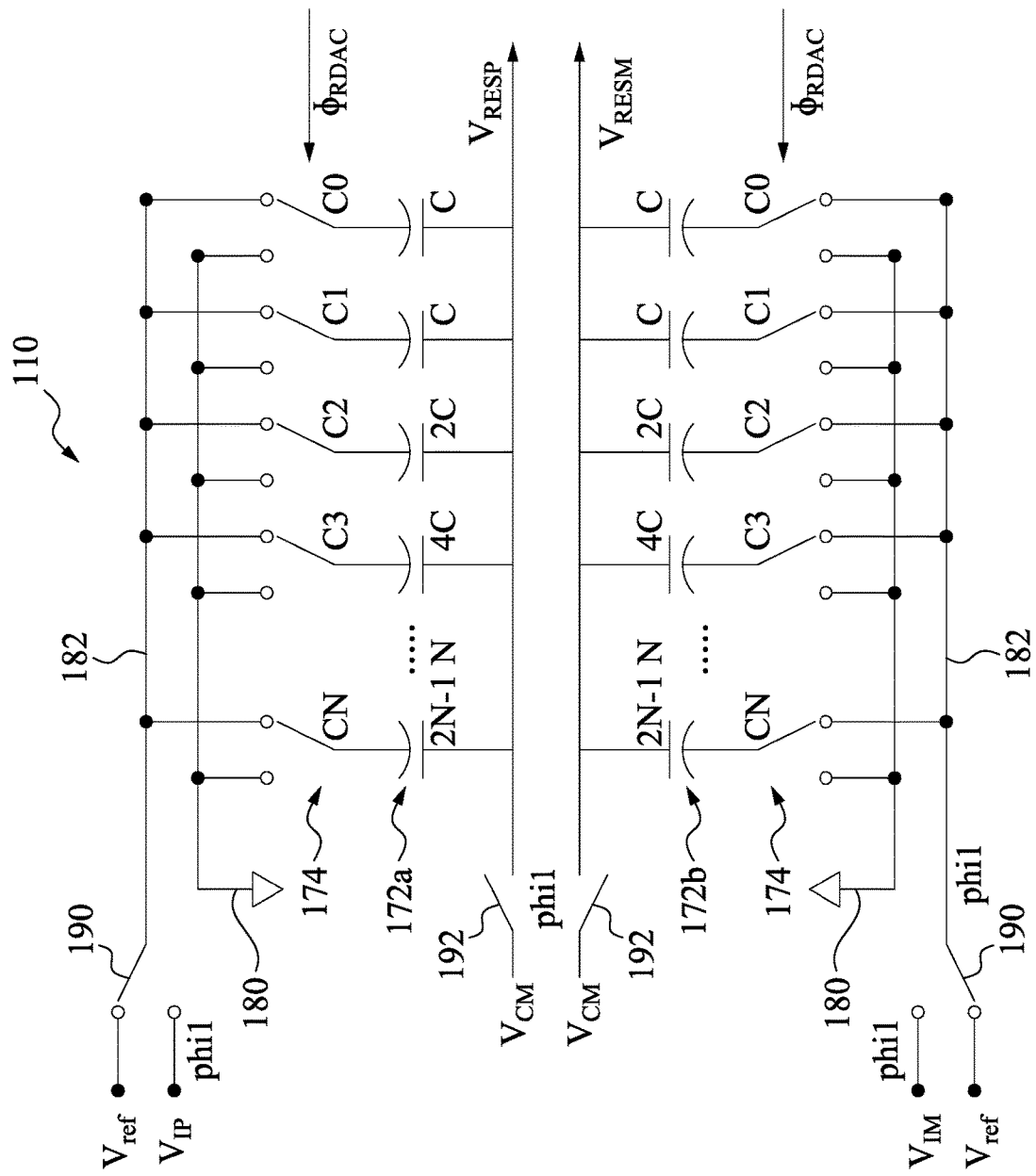
FIG. 6 is a circuit diagram illustrating an example of a residue DAC shown in the ADC system of FIG. 2 in accordance with some embodiments.

FIG. 6 illustrates an example of the residue DAC 110 of the first ADC stage 108 of the ADC 100. The residue DAC 110 includes a track and hold circuit with a binary weighted capacitor array. More specifically, the illustrated binary weighted capacitor array includes two sets of capacitors 172a, 172b corresponding respectively to the differential analog voltage inputs $V_{IP}$ and $V_{IM}$. Each of the sets of capacitors 172a, 172b includes a plurality of capacitors C0-CN, where N may correspond to the number of bits to be converted. The capacitors C0-CN may be sized for low-noise residue generation as determined by the "kT/C" thermal noise specification. A plurality of switches 174 are operatively connected to one side of the capacitors C0-CN of the sets of capacitors 172a, 172b. The switches 174 are controlled by $\phi_{RDAC}$ clock phase signals output by the SAR logic block 132 to selectively connect one side of the capacitors C0-CN to a ground rail 180 or a voltage rail 182. The voltage rail 182 is selectively connected either to the differential input voltages $V_{IM}$, $V_{IP}$ or the reference voltage $V_{ref}$ by switches 190 that are responsive to the first phase control signal phi1. The first phase control signal phi1 further controls switches 192 to selectively connect the bottom plates of the capacitors C0-CN to the common mode voltage $V_{CM}$.

Figure 7:
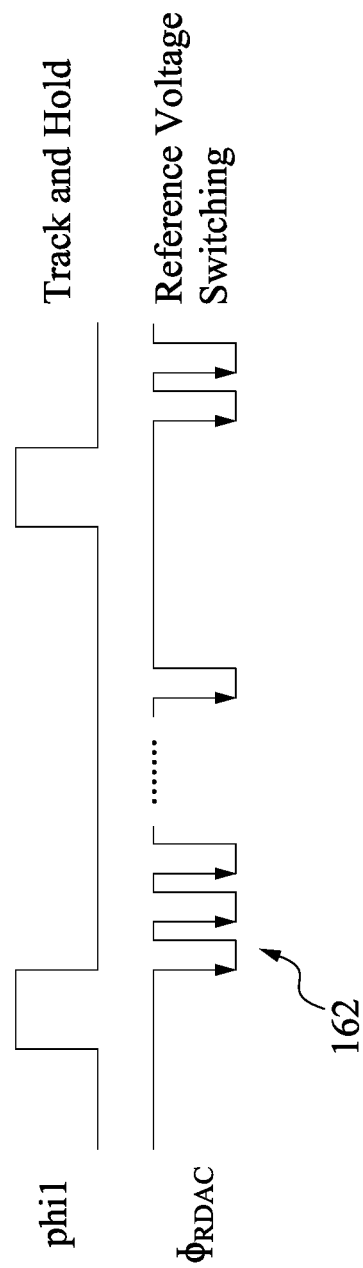
FIG. 7 is a signal diagram illustrating examples of control signals for the residue DAC shown in FIG. 6 in accordance with some embodiments.

As shown in FIG. 6, when the first phase control signal phi1 is high, the switches 190 couple the voltage rail 182 to the analog input signals $V_{IP}$, $V_{IM}$ and the switches 192 couple the bottom plates of the capacitors to the common mode voltage signal $V_{CM}$ such that the residue DAC 110 tracks the analog input voltage signals $V_{IP}$, $V_{IM}$. As shown in FIG. 7, when the first phase control signal phi1 goes low, the $\phi_{RDAC}$ digital residue signal pulses 162 control the switches 174 to selectively connect the capacitors C0-CN to the reference voltage $V_{ref}$ to generate the differential analog residue signals $V_{RESP}$, $V_{RESM}$.

Figure 8:
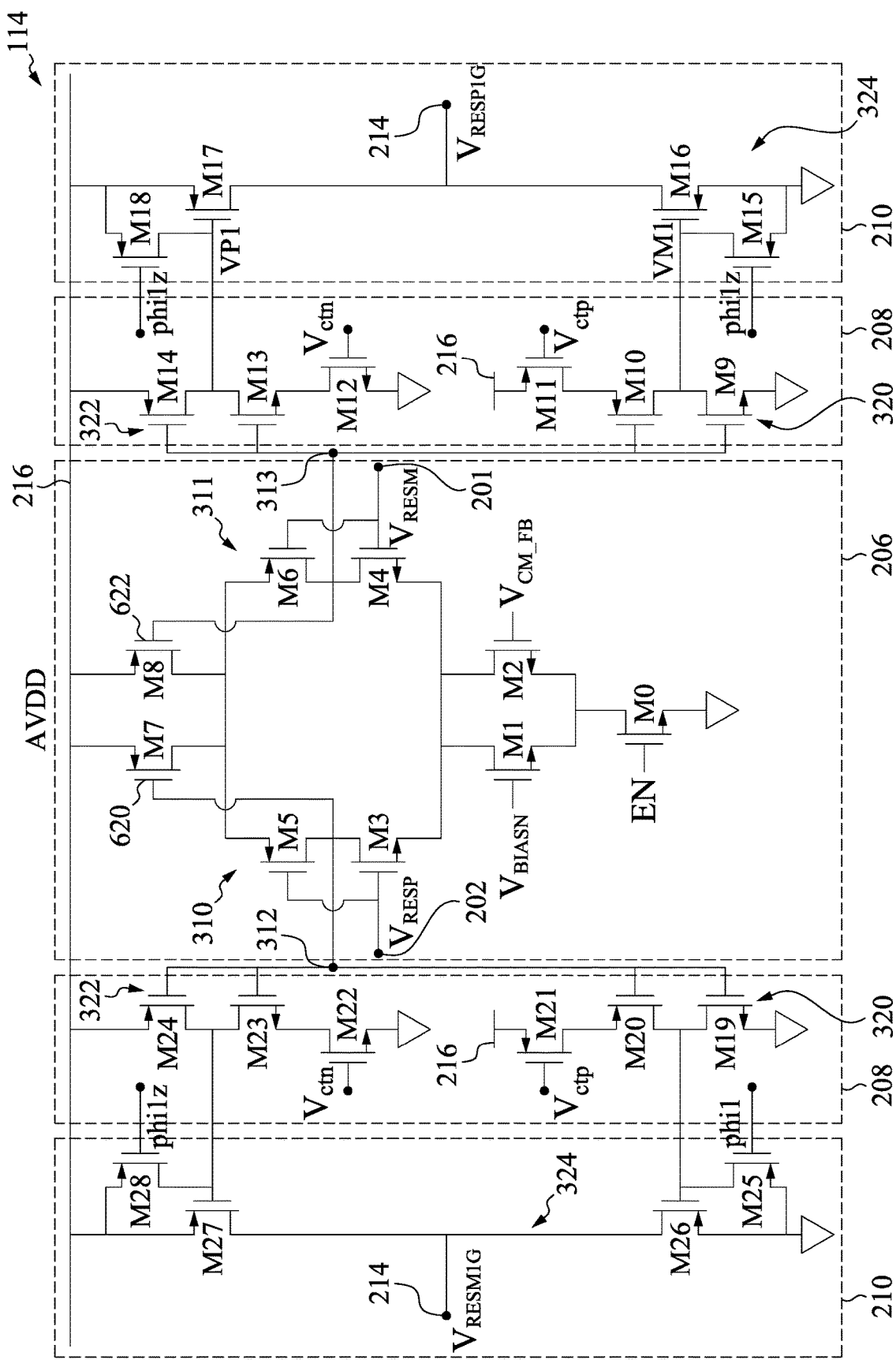
FIG. 8 is a circuit diagram illustrating an example of an inverter based residue amplifier in accordance with some embodiments.

FIG. 8 illustrates an example of the inverter based residue amplifier 114. The example residue amplifier 114 includes three inverter based stages 206, 208, 210. The inverter based stages allow for a nearly rail-to-rail output range and provide a high dynamic charging current. The example inverter based residue amplifier 114 shown in FIG. 8 receives and amplifies the differential residue voltage signal $V_{RESM}$, $V_{RESP}$, and thus is essentially "mirrored" about a vertical centerline of the amplifier circuit. Thus, the second and third stages 206, 208 each include left and right sections on either side of the symmetrical first stage 206 in a fully differential fashion. This is just one example and it should be appreciated that other design layouts are possible to implement an inverter based residue amplifier. The amplifier 114 is connected between a voltage supply rail 216 configured to receive a supply voltage AVDD and ground. In some embodiments, the amplifier 114 is configured to operate in with a low voltage supply, for example, less than 1.0V. In the illustrated embodiment, the AVDD supply voltage is 0.8 volts. The inverter based stages operating dynamically at a low voltage supply consume less power than a conventional cascode class A residue amplifier.

The first stage 206 includes input terminals 201, 202 configured to receive the differential analog residue signals $V_{RESM}$, $V_{RESP}$, respectively. The input terminals 201, 202 are coupled to first and second inverters 310, 311, the outputs of which are coupled to the second stage 208 at nodes 312, 313. In the illustrated example, the first inverter 310 comprises transistors M3, M5 and the second inverter 311 comprises transistors M4, M6. The outputs of the first inverters 310, 311 of the first stage 206 are further connected to gate terminals of transistors M7 and M8, respectively, which couple the supply voltage terminal 216 to the first inverters 310, 311. The transistors M7, M8 thus control the current flow to the first inverters 310,311 based on the inverted input voltage signals $V_{RESP}$, $V_{RESM}$. An enable transistor M0 has its source connected to the ground terminal, and is configured to receive an enable signal EN at its gate, which is the complement of the phi1 control signal. As such, the enable transistor M0 selectively enables or disables the amplifier 114 effectively in response to the phi1 control signal, from which the enable EN signal is derived. Transistors M1 and M2 are connected between the first and second inverters 310,311 and the drain of the enable transistor M0. The transistors M1 and M2 are configured to receive a bias signal $V_{BIASN}$ and the common mode feedback signal $V_{CM}$ at their gates, respectively, which set the bias current of the first stage 206. In some implementations, transistors M0, M7 and M8 operate in the linear region, while transistors M1 and M2 operate in the saturation region and therefore act as constant current sources. Accordingly, the first amplifier stage 206 functions as a differential input pair.

The output nodes 312, 313 of the first stage inverters 310, 311 are coupled to the input of the second amplifier stage 208. For simplicity, only the right-side portions viewed in FIG. 8 of the second and third amplifier stages 208, 210 will be discussed in detail. The second stage 208 is configured to selectively embed a dead zone between the current paths driving the output of the amplifier 114 by employing a dynamic current starving technique via transistors M11 and M12, which are operated in triode region—i.e., as variable resistors.

More particularly, in the example shown in FIG. 8, the current control transistor M11 is connected between the AVDD voltage supply terminal 216 and a lower second stage inverter 320. The current control transistor M12 is connected between the ground terminal and an upper second stage inverter 322. The lower and upper second stage inverters 320, 322 include transistors M9/M10 and M13/M14, respectively. The gates of the current control transistors M11, M12, are configured to receive differential second phase control signals $V_{ctp}$, $V_{ctn}$, respectively. As will be discussed further below, the differential control signals $V_{ctp}$, $V_{ctn}$ are generated to selectively modulate the resistance of the control transistors M11, M12. The current control transistors M11, M12 are thus operated to selectively change the effective trigger points of the lower and upper second stage inverters 320, 322 and control the dead zone established in the third stage 210 during amplification of the residue signal $V_{RESP}$, $V_{RESM}$.

The lower and upper second stage inverters 320, 322 provide intermediate differential voltage signals VM1, VP1 to the third amplifier stage 210, which is the output stage for the residue amplifier 114. The third stage 210 includes first and second output transistors M16, M17 connected between the AVDD supply voltage terminal 216 and ground. The output transistors M16, M17 form a third stage inverter 324, which provides the amplified differential residue signals $V_{RESP1G}$, $V_{RESM1G}$ at output terminals 214. A first control transistor M15 is connected between the gate of the first output transistor M16 and ground, and a second control transistor M18 is connected between the gate of the second output transistor M17 and the AVDD supply voltage terminal 216. The gate of the first control transistor M15 is configured to receive the first phase control signal phi1, while the gate of the second control transistor M18 is configured to receive the compliment of the first phase control signal phi1z.

As noted above, the lower and upper second stage inverters 320, 322 of the second amplifier stage 208 provide intermediate differential voltage signals VM1, VP1 to the third amplifier stage 210. The second amplifier stage 208 in the example shown in FIG. 8 simply includes the lower and upper inverters 320, 322 connected between the supply voltage input terminal 216 and ground. As such, the second stage 208 operates at a very high gain—the intermediate differential voltage signals VP1, VM1 may tend to go to the supply voltage level and ground. This could result in an unstable operation.

To stabilize operation of the residue amplifier 114, the second stage 208 is configured to create a dead zone in the third stage 210. More particularly, the second stage differential control signals $V_{ctp}$, $V_{ctn}$ are received by the second stage current control transistors M11, M12 to selectively disconnect the second stage upper inverter 322 and lower inverter 320 from the AVDD supply voltage terminal 216 and ground, respectively. This, in turn, cuts off second and first output transistors M17 and M16, respectively.

Figure 9:
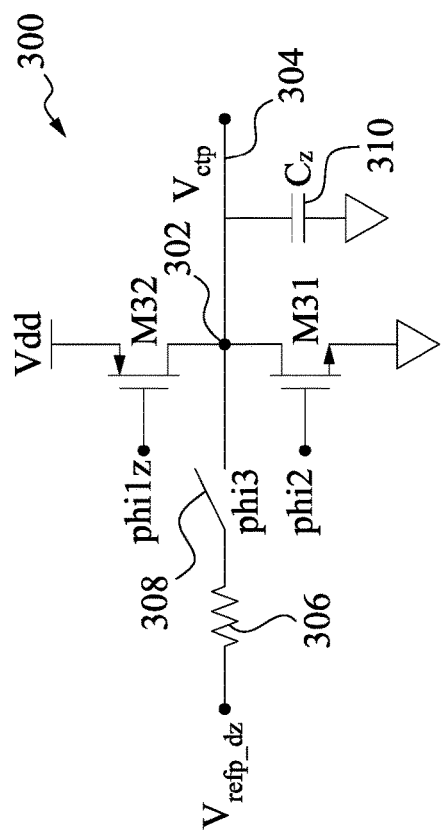
FIG. 9 is a circuit diagram illustrating an example of a control circuit for the inverter based residue amplifier of FIG. 8 in accordance with some embodiments.
Figure 10:
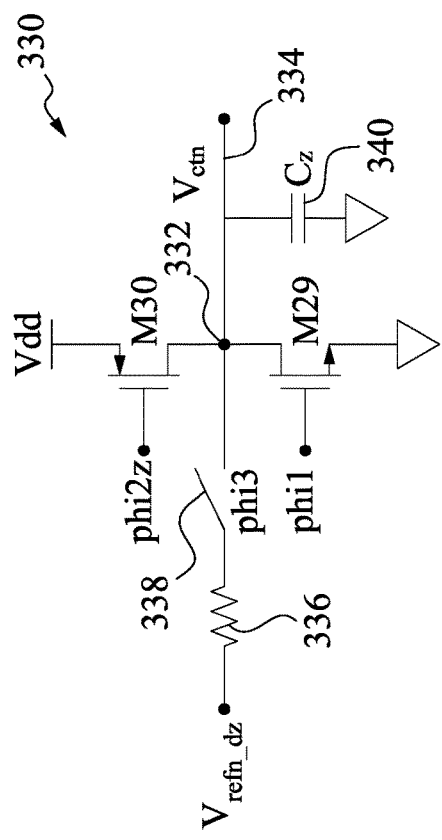
FIG. 10 is a circuit diagram illustrating an example of another control circuit for the inverter based residue amplifier of FIG. 8 in accordance with some embodiments.

FIGS. 9 and 10 illustrate examples of control circuits for providing the second stage differential control signals $V_{ctp}$, $V_{ctn}$, which are received by the current control transistors M11, M12 of the second stage 208 of the residue amplifier 114. The $V_{ctp}$ control circuit 300 shown in FIG. 9 includes transistors M32 and M31 connected between a Vdd voltage terminal and ground. The transistor M31 is configured to receive the second phase control signal phi2, and the transistor M32 is configured to receive the complement of the first phase control signal phi1z. A node 302 is formed at the junction of the transistors M32 and M31, which is connected to an output terminal 304 for outputting the control signal $V_{ctp}$. A capacitor 310 is further connected between the node 302 and ground. A resistor 306 is connected between a reference voltage $V_{refp\_dz}$ and a switch 308. The switch 308 is operated in response to the third phase control signal phi3 to selectively connect some portion of the reference voltage $V_{refp\_dz}$ to the node 302.

In some examples, the Vdd voltage is lower than the AVDD voltage connected to the supply voltage terminal 216 of the residue amplifier 114. For instance, the AVDD voltage may be 0.8 volts in some embodiments, and the corresponding Vdd voltage level may be 0.75 volts. The reference voltages $V_{refp\_dz}$ and $V_{refn\_dz}$ are set at a level about half of the Vdd voltage level. In the illustrated example, $V_{refp\_dz}$ is 0.4 volts, and $V_{refn\_dz}$ is 0.3 volts.

The Van control circuit 330 shown in FIG. 10 includes transistors M30 and M29 connected between the Vdd terminal and ground. The transistor M29 is configured to receive the first phase control signal phi1, and the transistor M30 is configured to receive the complement of the second phase control signal phi2z. A node 332 is formed at the junction of the transistors M30 and M29, which is connected to an output terminal 334 for outputting the control signal Van. A capacitor 340 is further connected between the node 332 and ground, and a negative reference voltage $V_{refn\_dz}$ is connected to the node 332 via a resistor 336 and a switch 338. The switch 338 is operated in response to the third phase control signal phi3.

Figure 11:
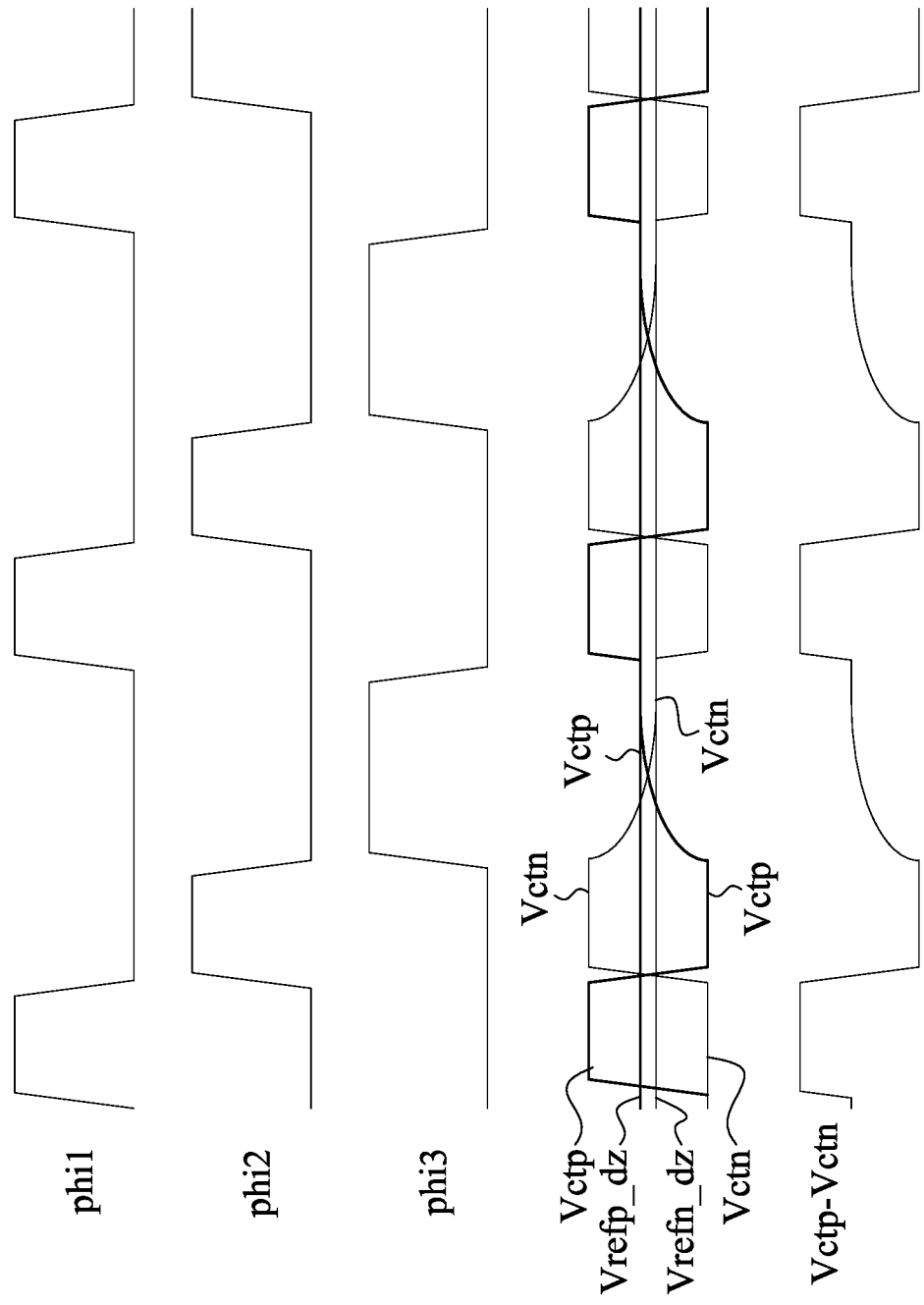
FIG. 11 is a signal diagram illustrating example waveforms generated by the control circuits of FIGS. 9 and 10 in accordance with some embodiments.

FIG. 11 shows examples of various waveforms illustrating the operation of the $V_{ctp}$ and $V_{ctn}$ control circuits 300, 330 of FIGS. 9 and 10. FIG. 11 illustrates example signals for the first, second, and third control phases phi1, phi2, phi3, as well as the reference input signals $V_{refp\_dz}$, $V_{refn\_dz}$ and control output signals $V_{ctp}$, Van for the control circuits 300, 330 of FIGS. 9 and 10. FIG. 11 further illustrates a signal $V_{ctp}$-$V_{ctn}$ showing the difference between the control signals $V_{ctp}$ and $V_{ctn}$.

During the first operation phase, the first phase control signal phi1 is high, while the second and third phase control signals phi2, phi3 are low. Thus, during the first control phase, the phi1z, phi2 and phi3 control signals are all low, while the phi1 and phi2z signals are both high. The low phi3 signal opens the switches 308 and 338, disconnecting the reference voltages $V_{refp\_dz}$ and $V_{refn\_dz}$ from their corresponding nodes 302 and 336. Referring to FIG. 9, the low phi2 signal turns off the NMOS transistor M31, and the low phi1z signal turns on the PMOS transistor M32, connecting the node 302 to the Vdd terminal and charging the $V_{ctp}$ control signal to nearly the Vdd voltage level. Referring now to FIG. 10, the high phi2z signal turns off the PMOS transistor M30, disconnecting the node 330 from the Vdd voltage terminal. The high phi1 signal turns on the NMOS transistor M29, connecting the node 330 to ground and pulling the $V_{ctn}$ signal at the output terminal 334 low.

Referring back to FIG. 8, the low control signal Van is received at the gate of the current control NMOS transistor M12 of the upper inverter 322, and the high control signal $V_{ctp}$ is received at the gate of the PMOS current control transistor M11 of the lower inverter 320. The low control signal $V_{ctn}$ turns off the transistor M12 and disconnects the upper inverter 320 of the second stage 208 from ground. The high control signal $V_{ctp}$ turns off the transistor M11 and cuts off the lower inverter 320 of the second stage 208 from the AVDD terminal 216, cutting off the first amplifier stage 208 from the third amplifier stage 212.

The high first phase control signal phi1 and its low complement signal phi1z received at the respective gates of the control transistors M15 and M18 turn these control transistors on, in turn turning off the output transistors M16 and M17 of the amplifier third stage 210.

Referring to FIGS. 9 and 10, during the second operation phase the second phase control signal phi2 is high, while the first and third phase control signals phi1, phi3 are low. The switches 308 and 338 remain open based on the low phi3 signal, disconnecting the reference voltages $V_{refp\_dz}$ and $V_{refn\_dz}$ from their corresponding nodes 302 and 336. Referring to FIG. 9, the high phi2 signal turns on the NMOS transistor M31, and the high phi1z signal turns off the PMOS transistor M32, connecting the node 302 to the ground terminal and pulling the $V_{ctp}$ low. Referring to FIG. 10, the low phi1 signal turns off the NMOS transistor M29, and the low phi2z signal turns on the PMOS transistor M30, connecting the node 330 to the Vdd voltage terminal.

The low $V_{ctp}$ signal received at the gate of the transistor M11 of the lower inverter 320 turns on the PMOS transistor M11, connecting the lower inverter 320 to the AVDD voltage supply terminal 216. The high Van signal received at the gate of the transistor M12 of the upper inverter 322 turns on the NMOS transistor M12, connecting the upper inverter 322 to the ground terminal. The upper and lower inverters 322, 320 are thus each connected between the AVDD supply terminal 216 and ground. As noted previously, the phi1 signal is low during the second control phase and its complement signal phi1z is high. The high phi1z signal received at the gate of the second control transistor M18 turns off the transistor M18, while the low phi1 signal received at the gate of the first control transistor M15 turns off the transistor M15. Thus, the output transistors M16, M17 of the third amplifier stage 210 are coupled between the AVDD voltage supply terminal 216 and the ground terminal, and the residue amplifier 114 is auto-zeroed during the second control phase.

During the third operation phase, the first and second phase control signals phi1, phi2 are both low. The first and second complement phase control signals phi1z, phi2z are thus both high. These signals cause the transistors M29, M30, M31, and M32 to all turn off. The third phase control signal phi3 goes high, closing the switches 308 and 338 to connect the reference voltages $V_{refp\_dz}$ and $V_{refn\_dz}$ to their corresponding nodes 302 and 336. Accordingly, the control signals $V_{ctp}$ and $V_{ctn}$ settle at the $V_{refp\_dz}$ and $V_{refn\_dz}$ voltage levels, which as noted previously are at about the midpoint between ground and Vdd. The $V_{ctp}$-$V_{ctn}$ waveform of Figure more clearly shows this intermediate control signal level. The control signals $V_{ctp}$ and $V_{ctn}$ at the $V_{refp\_dz}$ and $V_{refn\_dz}$ voltage levels are applied to the gates of the second stage current control transistors M11 and M12, respectively as shown in FIG. 8. This changes the effective trigger point of the second stage inverters 320, 322, and pulls the intermediate voltages VM1 and VP1 away from the AVDD and ground rail voltages to a stable region.

By using multiple inverter based stages, lower voltage requirements are needed since the inverter based stages allow for almost rail-to-rail output range. Also, since the slew rate current of an inverter behaves like a digitally switched current source, the inverter based stages provide for a high dynamic charging current. Additionally, as process scaling moves smaller, the performance of the residue amplifier 114 improves since the time delay of the inverters improve when made smaller. Thus the conversion rate of the inverter based amplification improves with process scaling. Also, less power is consumed since power consumption is determined by dynamic current control signals $V_{ctn}$, $V_{ctp}$ applied to the transistors M12, M11 of the second amplifier stage 208.

As noted above, the amplified residue signal $V_{RES1G}$ is output to one or more subsequent ADC stages. In the example shown in FIG. 2, there second and third ADC stages 116, 120. Other embodiments could include more or fewer ADC stages. The amplified first residue signal $V_{RESP1G}$ is received by the second ADC stage 116, which performs the A/D conversion of the amplified residue signal $V_{RES1G}$ and outputs the second digital signal $D_2$, as well as the differential second residue signal $V_{RESP2}$, $V_{RESM2}$. The second residue amplifier 118, which may be configured and operated as shown in FIG. 8, outputs the amplified second residue signal $V_{RES2G}$, which is received by the third ADC stage 120. The third ADC stage 120 performs the A/D conversion of the differential second residue signal $V_{RESP2}$, $V_{RESM2}$ to output the third digital signal $D_3$ that represents the LSBs of the digital output signal $D_{OUT}$.

Figure 12:
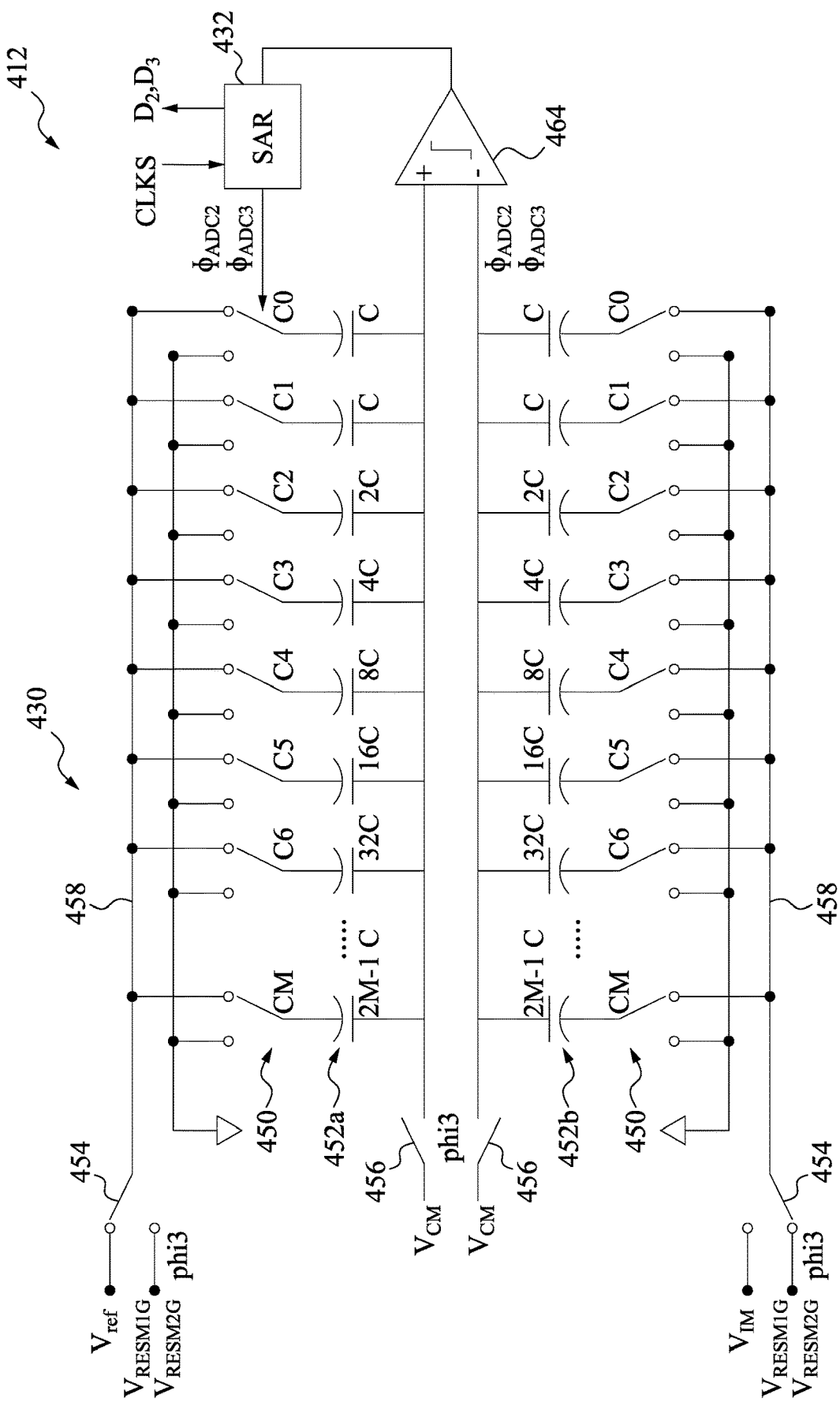
FIG. 12 is a circuit diagram illustrating an example of the second and third sub-ADCs of FIG. 2 in accordance with some embodiments.

FIG. 12 illustrates an example implementation of the second and third ADC stages 116, 120 in accordance with some embodiments. More specifically, in the illustrated embodiment, the second and third ADC stages 116, 120 each include a SAR ADC. The SAR ADCs of the second and third ADC stages 116, 120 include a track and hold circuit 430, comparator 434 and SAR logic block 432. The SAR logic 432 receives the clock signal CLKS and provides pulsed control signals $\phi_{ADC2}$ (second ADC stage control signals) and $\phi_{ADC3}$ (third ADC stage control signals) to the track and hold circuit 430. The control signals $\phi_{ADC2}$, $\phi_{ADC3}$ are derived from the complement of the third phase control signal phi3, since the second and third ADC stages sample the amplified residue signals $V_{RES1G}$, $V_{RES2G}$ during the third operation phase.

The second and third stage control signals $\phi_{ADC2}$, $\phi_{ADC3}$ control the operation of a plurality of switches 450 operatively connected to one side of a plurality of capacitors C0-CM. There are two sets of capacitors 452a, 452b corresponding respectively to the differential analog residue signals $V_{RESP1G}$, $V_{RESM1G}$ and $V_{RESP2G}$, $V_{RESM2G}$. Each of the sets of capacitors 452a, 452b includes a plurality of capacitors C0-CM, where M may correspond to the number of bits to be converted, which in the illustrated example correspond to the 5 bits of the $D_2$ signal and 8 bits of the $D_3$ signal. In some examples, the capacitors C1-CM may be binary weighted and the capacitor C0 is a "dummy LSB" capacitor.

The control signals $\varphi_{ADC2}$, $\varphi_{ADC3}$ control the switches 450 to connect the capacitors 152a, 152b between an analog input voltage rail 458 and ground. The third phase control signal phi3 further controls the switches 454 to selectively connect the analog input voltage rail 458 between the analog residue signals $V_{RESP1G}$, $V_{RESM1G}$ or $V_{RESP2G}$, $V_{RESM2G}$ and the reference voltage $V_{ref}$. The third phase control signal phi3 further controls switches 456 to selectively connect the other side of the capacitors C0-CM to the common mode feedback signal $V_{CM}$.

When the third phase control signal phi3 is high, the switches 450 operate to connect the top plates of the capacitors C0-CM of the sets of capacitors 452a, 452b to the analog residue signals $V_{RESP1G}$, $V_{RESM1G}$ or $V_{RESP2G}$, $V_{RESM2G}$. The high phi3 signal further operates the switches 456 to connect the bottom plates of the capacitors C0-CM of the sets of capacitors 452a, 452b to the common mode feedback voltage signal $V_{CM}$ to sample the analog residue signals $V_{RESP1G}$, $V_{RESM1G}$ or $V_{RESP2G}$, $V_{RESM2G}$. The second and third SAR control signals $\phi_{ADC2}$, $\phi_{ADC2}$ each include a series of pulses that control the SAR binary search algorithm and generate the second and third digital output signals $D_2$, $D_3$.

FIG. 13 is a flow diagram illustrating an ADC method 500 in accordance with aspects of the present disclosure. Referring to FIG. 13 together with FIGS. 1 and 3B, at an operation 510 an analog input voltage signal $V_{IN}$ is sampled during a first operation phase 10. At operation 512, the inverter based residue amplifier 114 is disabled during the first operation phase 10. The analog input voltage signal $V_{IN}$ is converted to a first digital value $D_1$ corresponding to the analog input voltage signal $V_{IN}$ during a second operation phase 20 in an operation 514. In operation 516, a first analog residue signal $V_{RES1}$ corresponding to a difference between the first digital value $D_1$ and the analog input signal $V_{IN}$ is determined during the second operation phase 20. The first analog residue signal $V_{RES1}$ is amplified by the inverter based residue amplifier 114 during a third operation phase 30 in operation 518. In operation 520, the amplified first analog residue signal $V_{RES1G}$ is converted to a second digital value $D_2$ corresponding to the amplified first analog residue signal $V_{RES1G}$, and the first and second digital values $D_1$, $D_2$ are combined to a digital output signal $D_{OUT}$ representing the analog input voltage signal in operation 522.

Accordingly, the present disclosure includes examples of a multi-stage hybrid ADC with inverter based residue amplifiers connecting ADC stages. In accordance with some disclosed examples, the residue amplifier is a fully differential residue amplifier with three stages. The first stage is a differential input pair. The second stage embeds a dead zone between the paths driving output transistors of the third amplifier stage. The third stage operates at sub-threshold operation levels, thus ensuring a high output resistance to form a dominant pole for stable feedback operation. Moreover, disclosed examples are amenable to implementation in advanced low voltage deep sub-micron process technologies.

In accordance with some embodiments, an ADC system includes an input terminal configured to receive an analog input voltage signal. A first ADC stage is coupled to the input terminal and is configured to output a first digital value corresponding to the analog input voltage signal and a first analog residue signal corresponding to a difference between the first digital value and the analog input signal. A first inverter based residue amplifier is configured to receive the first analog residue signal, amplify the first analog residue signal, and output a first amplified residue signal. A second ADC stage is configured to receive the first amplified residue signal and output a second digital value corresponding to the first amplified analog residue signal and a second analog residue signal corresponding to a difference between the second digital value and the first amplified analog residue signal. A second inverter based residue amplifier is configured to receive the second analog residue signal, amplify the second analog residue signal, and output a second amplified residue signal. A third ADC stage is configured to receive the second amplified residue signal and output a third digital value corresponding to the second amplified analog residue signal. A controller is coupled to the first, second and third ADC stages and configured to combine the first, second and third digital values into a digital output signal representing the analog input voltage signal.

In accordance with further disclosed examples, an ADC includes an input terminal configured to receive an analog input voltage signal. A first ADC stage is coupled to the input terminal and is configured to output a first digital value corresponding to the analog input voltage signal and a first analog residue signal corresponding to a difference between the first digital value and the analog input signal. A first inverter based residue amplifier is configured to receive the first analog residue signal, amplify the first analog residue signal, and output a first amplified residue signal. In some embodiments, the first inverter based residue amplifier includes a first amplifier stage having an input inverter coupled between first and second voltage terminals. The first stage inverter is configured to receive the first analog residue signal. A second amplifier stage has first and second inverters coupled between the first and second voltage terminals and is configured to receive an output of the first amplifier stage. Corresponding first and second control devices are configured to control current flow through the first and second inverters in response to a control signal. A third amplifier stage includes an output inverter coupled between the first and second voltage terminals and is configured to receive an output of the second amplifier stage. A control circuit is coupled to the first and second control devices and is configured to generate the control signal.

In accordance with still further examples, an ADC method includes sampling an analog input voltage signal during a first operation phase, and disabling an inverter based residue amplifier during the first operation phase. The analog input voltage signal is converted to a first digital value corresponding to the analog input voltage signal during a second operation phase. A first analog residue signal corresponding to a difference between the first digital value and the analog input signal is determined during the second operation phase. The first analog residue signal is amplified by the inverter based residue amplifier during a third operation phase. The amplified first analog residue signal is converted to a second digital value corresponding to the amplified first analog residue signal, and the first and second digital values are combined into a digital output signal representing the analog input voltage signal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An analog-to-digital converter ("ADC"), comprising:
   first and second input terminals configured to receive an analog input voltage signal;
   a first ADC stage coupled to the input terminal and configured to output a first digital value corresponding to the analog input voltage signal and a first analog residue signal corresponding to a difference between the first digital value and the analog input signal;
   a first amplifier stage including a first inverter having a residue input terminal configured to receive the first analog residue signal;
   a second amplifier stage having first and second inverters configured to receive an output of the first amplifier stage, and corresponding first and second control devices configured to control current flow through the first and second inverters in response to a control signal;
   a third amplifier stage including an output inverter configured to receive an output of the second amplifier stage and output a first amplified residue signal;
   a second ADC stage configured to receive the first amplified residue signal and output a second digital value corresponding to the first amplified analog residue signal;
   a controller configured to combine the first and second digital values into a digital output signal representing the analog input voltage signal.

2. The ADC of claim 1, wherein the first ADC stage is configured to sample the analog input voltage signal during a first operation phase and convert the sampled analog input voltage signal to the first digital value during a second operation phase, and determine the first analog residue signal during the second operation phase.

3. The ADC of claim 1, wherein the second ADC stage is configured to convert the amplified first analog residue signal to a second digital value corresponding to the amplified first analog residue signal during the first operation phase.

4. The ADC of claim 1, wherein the first ADC stage includes a successive approximation register (SAR) ADC configured to convert the analog input voltage signal to the first digital value.

5. The ADC of claim 4, wherein the SAR ADC includes a sample and hold circuit comprising an array of binary weighted capacitors configured to sample the analog input voltage signal.

6. The ADC of claim 1, wherein the first ADC stage includes a digital-to-analog converter (DAC) configured to receive the analog input voltage signal and the first digital value, and output the first analog residue signal.

7. The ADC of claim 1, wherein the second ADC stage is configured to output a second analog residue signal corresponding to a difference between the second digital value and the first amplified analog residue signal.

8. The ADC of claim 7, further comprising an inverter based residue amplifier configured to receive the second analog residue signal, amplify the second analog residue signal, and output a second amplified residue signal.

9. The ADC of claim 8, further comprising a third ADC stage configured to receive the second amplified residue signal and output a third digital value corresponding to the second amplified analog residue signal, wherein the controller is configured to combine the first, second and third digital values into the digital output signal representing the analog input voltage signal.

10. A method, comprising:
    receiving an analog input signal;
    receiving the analog input signal by a first amplifier stage having an input inverter coupled between first and second voltage terminals;
    providing an output of the first amplifier stage to a second amplifier stage having first and second inverters coupled between the first and second voltage terminals;
    controlling current flow through the first and second inverters of the second amplifier stage by inputting first and second control signals to corresponding first and second control devices;
    providing an output of the second amplifier stage to a third amplifier stage including an output inverter coupled between the first and second voltage terminals; and
    outputting an amplified output signal corresponding to the analog input signal by the third amplifier stage.

11. The method of claim 10, wherein the first control device is connected between the first inverter and the first voltage terminal, and wherein the second control device is connected between the second inverter and the second voltage terminal.

12. The method of claim 10, wherein the first control device comprises a PMOS transistor and the second control device comprises and NMOS transistor, and wherein controlling current flow through the first and second inverters of the second amplifier stage includes operating the first and second control devices in a triode region.

13. The method of claim 10, wherein the first and second control signals are input to the corresponding first and second control devices at a first voltage level during a first operation phase, a second voltage level during a second operation phase, and a third voltage level between the first and second voltage levels during a third operation phase.

14. The method of claim 10, further comprising selectively creating a dead zone in the third amplifier stage by the second amplifier stage.

15. The method of claim 10, further comprising selectively disconnecting the output inverter from the first and second voltage supply terminals.

16. The method of claim 15, wherein selectively disconnecting the output inverter from the first and second voltage supply terminals includes controlling first and second control devices coupled to respective first and second transistors of the third amplifier stage.

17. The method of claim 16, further comprising selectively enabling or disabling the first amplifier stage in response to a first operation phase control signal.

18. An analog-to-digital converter ("ADC"), comprising:
    an input terminal configured to receive an analog input voltage signal;

a first ADC circuit coupled to the input terminal and configured to output a first digital value corresponding to the analog input voltage signal;

a digital-to-analog converter (DAC) circuit coupled to the input terminal and to an output of the first ADC circuit, and configured to output a first analog residue signal corresponding to a difference between the first digital value and the analog input signal;

a first inverter based residue amplifier configured to receive the first analog residue signal, amplify the first analog residue signal, and output a first amplified residue signal;

a second ADC stage configured to receive the first amplified residue signal and output a second digital value corresponding to the first amplified analog residue signal; and a controller coupled to the first and second ADC stages and configured to combine the first and second digital values into a digital output signal representing the analog input voltage signal.

19. The ADC of claim 18, further comprising:

a third ADC stage configured to receive the second amplified residue signal and output a third digital value corresponding to the second amplified analog residue signal; and wherein the controller is configured to combine the first, second and third digital values into the digital output signal representing the analog input voltage signal.

20. The ADC of claim 18, wherein the first inverter based residue amplifier includes:

a first amplifier stage having an input inverter coupled between first and second voltage terminals, the first stage inverter configured to receive the first analog residue signal;

a second amplifier stage having first and second inverters coupled between the first and second voltage terminals and configured to receive an output of the first amplifier stage, and corresponding first and second control devices configured to control current flow through the first and second inverters in response to a control signal;

a third amplifier stage including an output inverter coupled between the first and second voltage terminals and configured to receive an output of the second amplifier stage; and a control circuit coupled to the first and second control devices and configured to generate the control signal.

* * * * *